United States Patent
Lee (10) Patent No.: US 9,166,097 B2
(45) Date of Patent: Oct. 20, 2015

(54) THIN FILM TRANSISTOR SUBSTRATE AND MANUFACTURING METHOD THEREOF, DISPLAY

(71) Applicant: INNOLUX CORPORATION, Chu-Nan, Miao-Li County (TW)

(72) Inventor: Kuan-Feng Lee, Chu-Nan (TW)

(73) Assignee: INNOLUX CORPORATION, Chu-Nan (TW)

(*) Notice: Subject to any disclaimer, the term of this patent is extended or adjusted under 35 U.S.C. 154(b) by 56 days.

(21) Appl. No.: 13/910,974

(22) Filed: Jun. 5, 2013

(65) Prior Publication Data

US 2013/0328043 A1    Dec. 12, 2013

(30) Foreign Application Priority Data

Jun. 7, 2012  (TW) .............................. 101120425 A (51) Int. Cl.
*H01L 29/786* (2006.01)
*H01L 33/00* (2010.01)
*H01L 27/12* (2006.01)

(52) U.S. Cl.
CPC ........ *H01L 33/0041* (2013.01); *H01L 27/1288* (2013.01); *H01L 29/78633* (2013.01)

(58) Field of Classification Search
CPC ................................................ H01L 29/78633
USPC ............................................. 257/40; 438/29
See application file for complete search history.

(56) References Cited

U.S. PATENT DOCUMENTS

| 5,605,847 A | 2/1997 | Zhang | |
|---|---|---|---|
| 2006/0163583 A1* | 7/2006 | Jiroku | 257/66 |
| 2006/0246360 A1* | 11/2006 | Hwang | 430/5 |
| 2012/0018727 A1* | 1/2012 | Endo et al. | 257/57 |

FOREIGN PATENT DOCUMENTS

| CN | 102184965 | 9/2011 |
|---|---|---|
| CN | 102269900 | 12/2011 |
| KR | 20090073898 | 7/2009 |
| KR | 20100132308 | 12/2010 |
| TW | 200703652 | 1/2007 |
| TW | 200952178 | 12/2009 |
| TW | 201017302 | 5/2010 |
| TW | 201021612 | 6/2010 |
| TW | 201113952 | 4/2011 |
| TW | 201143099 | 12/2011 |
| TW | 201222676 | 6/2012 |

* cited by examiner

*Primary Examiner* — Cheung Lee
*Assistant Examiner* — Stephen Bradley
(74) *Attorney, Agent, or Firm* — Liu & Liu (57) ABSTRACT

An embodiment of the invention provides a thin film transistor substrate includes: a substrate; a plurality of transistors on the substrate, wherein each of the transistors includes: a light-blocking layer on the substrate; an active layer on the light-blocking layer; a gate insulating layer on the substrate and covering the active layer; a gate electrode on the gate insulating layer and over the active layer; a source electrode on the substrate and electrically connected to the active layer; and a drain electrode on the substrate and electrically connected to the active layer.

20 Claims, 10 Drawing Sheets

THIN FILM TRANSISTOR SUBSTRATE AND MANUFACTURING METHOD THEREOF, DISPLAY

CROSS REFERENCE TO RELATED APPLICATIONS

This Application claims priority of Taiwan Patent Application No. 101120425, filed on Jun. 7, 2012, the entirety of which is incorporated by reference herein.

BACKGROUND OF THE INVENTION

1. Field of the Invention

The present invention relates to a thin film transistor, and in particular relates to a thin film transistor substrate with a light-blocking layer and manufacturing methods thereof and a display.

2. Description of the Related Art

As display technology progressively develops, everyday life conveniences for people increase, due to the multitude of displays available. Light and thin features are desired for displays. Thus, flat panel displays (FPD) are now the most popular type of displays desired. There are many kinds of FPDs provided, among which liquid crystal displays (LCD) are popular among consumers because of the advantages such as efficient space utilization, low power consumption, no radiance, and low electromagnetic interference (EMI).

Liquid crystal displays are mainly formed by an active array substrate, a color filter substrate and a liquid crystal layer therebetween. The active array substrate has an active region and a peripheral circuit region. An active array is disposed in the active region, and a driving circuit with thin film transistors is disposed in the peripheral circuit region.

In the related art, liquid crystal displays (LCD) mainly use backlight modules as light sources during displaying the screen. However, when the light generated from the backlight module irradiates the active layer of the thin film transistor, the active layer is apt to generate a photo current, which affects electrical properties of the thin film transistor.

When the LCD adopts top-gate thin film transistors, the active layers of the top-gate thin film transistors are directly exposed to the light generated from the backlight module, and thereby the light affects electrical properties of the thin film transistors. When the LCD adopts bottom-gate thin film transistors, the bottom gate may block the light, but the active layers of the bottom-gate thin film transistors are easily damaged in subsequent processes (such as the forming processes of the source electrode, the drain electrode and the protective layer covering the source electrode and the drain electrode), which affects electrical properties of the thin film transistors.

BRIEF SUMMARY OF THE INVENTION

An embodiment of the invention provides a thin film transistor substrate which includes: a substrate; a plurality of thin film transistors disposed on the substrate, wherein each of the thin film transistors comprises: a light-blocking layer disposed on the substrate; an active layer disposed on the light-blocking layer and overlapped with the light-blocking layer; a gate insulating layer disposed on the substrate and covering the active layer; a gate electrode disposed on the gate insulating layer and over the active layer; a source electrode disposed on the substrate and electrically connected to the active layer; and a drain electrode disposed on the substrate and electrically connected to the active layer.

An embodiment of the invention provides a manufacturing method of a thin film transistor substrate, which includes: providing a substrate; forming a light-blocking layer on the substrate; forming an active layer on the light-blocking layer, wherein at least a portion of the edge of the active layer is recessed from a portion of the edge of the light-blocking layer by about 0.5 μm to about 3 μm; forming a gate insulating layer covering the active layer on the substrate; forming a gate electrode on the gate insulating layer, wherein the gate electrode is over the active layer; and forming a source electrode and a drain electrode on the substrate, wherein the source electrode and the drain electrode are electrically connected to the active layer.

An embodiment of the invention provides a display, which includes: a thin film transistor substrate as claimed in claim 1; a substrate opposite to the thin film transistor substrate; and a display medium formed between the thin film transistor substrate and the substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1A:
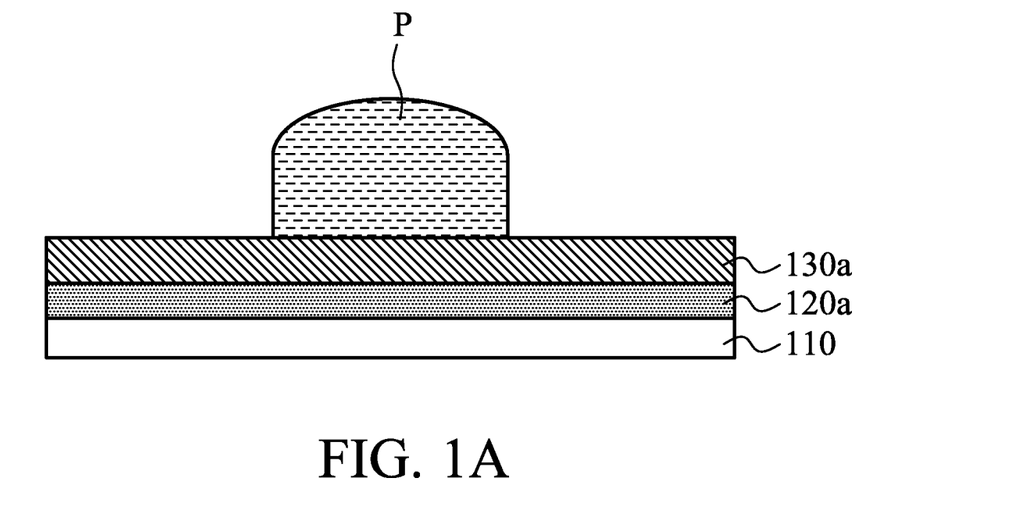
FIGS. 1A-1C are cross-sectional views of a manufacturing process of a thin film transistor substrate according to an embodiment of the present invention.
Figure 1B:
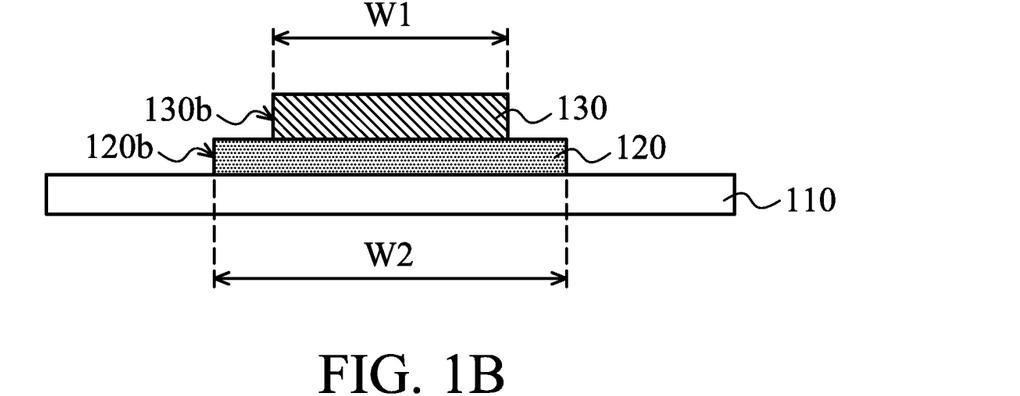
Figure 1C:
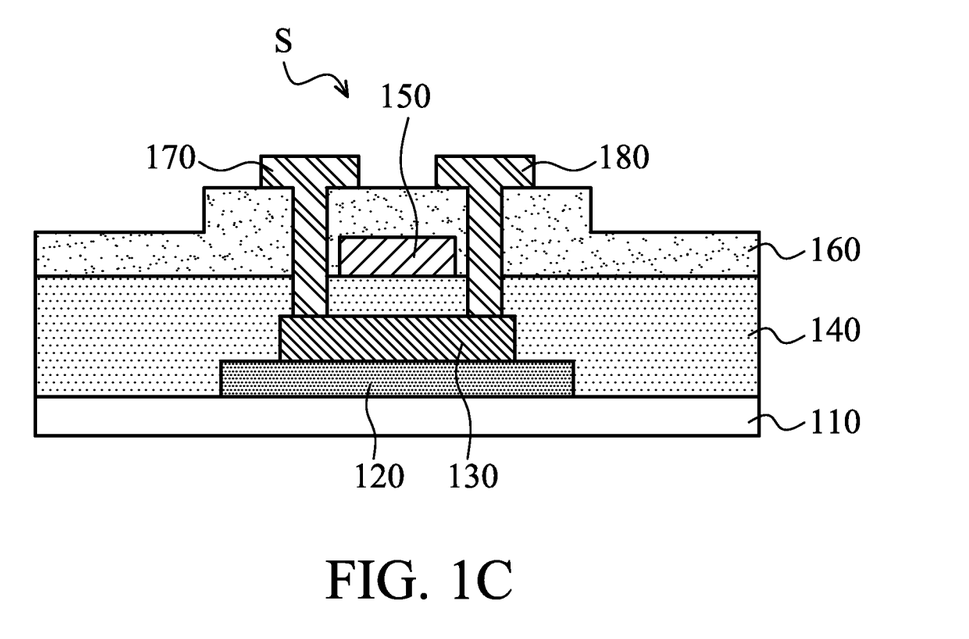

FIGS. 1A-1C are cross-sectional views of a manufacturing process of a thin film transistor substrate according to an embodiment of the present invention. Referring to FIG. 1A, a substrate 110 is provided, for example, a glass substrate. Then, a light-blocking material layer 120a is formed on the substrate 110. In one embodiment, the light-blocking material layer 120a includes metal materials or opaque polymer materials, wherein the metal materials include, for example, chromium, aluminum, copper or titanium, and the opaque polymer materials include, for example, resins doped with pigments.

Then, an active material layer 130a is formed on the light-blocking material layer 120a and is overlapped with the light-blocking material layer 120a. The active material layer 130a includes, for example, indium-gallium-zinc oxides (IGZO) or other semiconductor materials suitable for forming the active layer. Then, a photoresist layer P is formed on the active material layer 130a, wherein the photoresist layer P is patterned.

Then, referring to FIG. 1B, an etching process is performed on the active material layer 130a and the light-blocking material layer 120a by using the photoresist layer P as an etching mask to form a light-blocking layer 120 and an active layer 130 overlapped with the light-blocking layer 120. Specifically, in the present embodiment, the etching process includes: performing a wet etching process on the active material layer 130a by using, for example, an oxalic acid as an etching solution; and performing a dry etching process or a wet etching process on the light-blocking material layer 120a, wherein the wet etching process may use, for example, an orthoaluminic acid as an etching solution. Then, the photoresist layer P is removed.

It should be noted that, in the present embodiment, the light-blocking layer 120 is disposed between the substrate 110 and the active layer 130 to block the light from below (e.g. the light emitted by the backlight module of the display), which improves the stability of electrical properties of the active layer 130.

In the etching process, the active material layer 130a is easier to be etched than the light-blocking material layer 120a, so the edge 130b of the active layer 130 is recessed from the edge 120b of the light-blocking layer 120, and thereby the light-blocking layer 120 may more effectively block the light from below. In the present embodiment, the maximum width W1 of the active layer 130 is smaller than the maximum width W2 of the light-blocking layer 120. In one embodiment, the maximum width W1 of the active layer 130 is smaller than the maximum width W2 of the light-blocking layer 120 by about 1 μm to about 6 μm. In one embodiment, (a portion of or the whole of) the edge 130b of the active layer 130 is recessed from (a portion of or the whole of) the edge 120b of the light-blocking layer 120 by about 0.5 μm to about 3 μm.

Then, referring to FIG. 1C, a gate insulating layer 140 is formed on the substrate 110 and covers the active layer 130. The gate insulating layer 140 includes organic materials or oxides, wherein the organic materials include, for example, Polytetrafluoroethylene (PFA), silica based materials or acrylic based materials, and the oxides include aluminum oxides, silicon oxides, silicon nitride, titanium oxides or silicon aluminum oxides. Then, a gate electrode 150 is formed on the gate insulating layer 140, and the gate electrode 150 is located over the active layer 130. The gate electrode 150 may include aluminum and molybdenum, copper or other suitable conductive materials.

Then, an insulating protective layer 160 is optionally formed on the gate insulating layer 140 and covers the gate electrode 150. Then, a first through hole V1 and a second through hole V2 are formed and pass through the insulating protective layer 160 and the gate insulating layer 140, wherein the first through hole V1 and the second through hole V2 both expose the active layer 130. Then, a source electrode 170 and a drain electrode 180 are formed on the insulating protective layer 160, wherein the source electrode 170 and the drain electrode 180 may pass through the insulating protective layer 160 and the gate insulating layer 140 respectively through the first through hole V1 and the second through hole V2 to electrically connect to the active layer 130. In this case, the light-blocking layer 120, the active layer 130, the gate insulating layer 140, the gate electrode 150, the source electrode 170 and the drain electrode 180 constitute a thin film transistor S. It should be noted that FIGS. 1A-1C omit showing the forming of a plurality of thin film transistors S on other portion of the substrate 110 by using the above method.

According to the above descriptions, it is known that, in the present embodiment, the light-blocking layer 120 is formed between the substrate 110 and the active layer 130 to block the light from below (e.g. the light emitted by the backlight module of the display, not shown), which improves the stability of electrical properties of the active layer 130. Furthermore, the edge 130b of the active layer 130 is recessed from or aligned with the edge 120b of the light-blocking layer 120, and thereby the light-blocking layer 120 may more effectively block the light from below. The distance between the edge 120b of the light-blocking layer 120 and the edge 130b of the active layer 130 is less than or equal to 3 μm. In one embodiment, (a portion of or the whole of) the edge 130b of the active layer 130 is recessed from or aligned with (a portion of or the whole of) the edge 120b of the light-blocking layer 120.

FIGS. 2A-2E are cross-sectional views of a manufacturing process of a thin film transistor substrate according to another embodiment of the present invention. The present embodiment is similar to the embodiment of FIGS. 1A-1C, except that the present embodiment uses a half tone mask to pattern the photoresist layer to form a patterned photoresist layer with at least two thicknesses. The manufacturing process of the thin film transistor substrate of the present embodiment is described as follows.

Figure 2A:
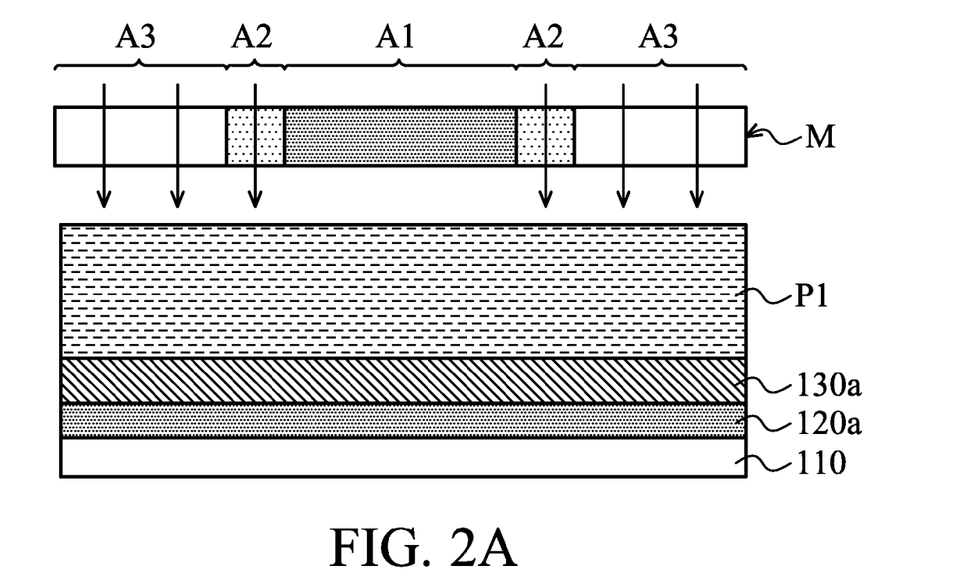
FIGS. 2A-2E are cross-sectional views of a manufacturing process of a thin film transistor substrate according to another embodiment of the present invention.

Referring to FIG. 2A, a substrate 110 is provided. Then, a light-blocking material layer 120a is formed on the substrate 110. Then, an active material layer 130a is formed on the light-blocking material layer 120a.

Figure 2B:
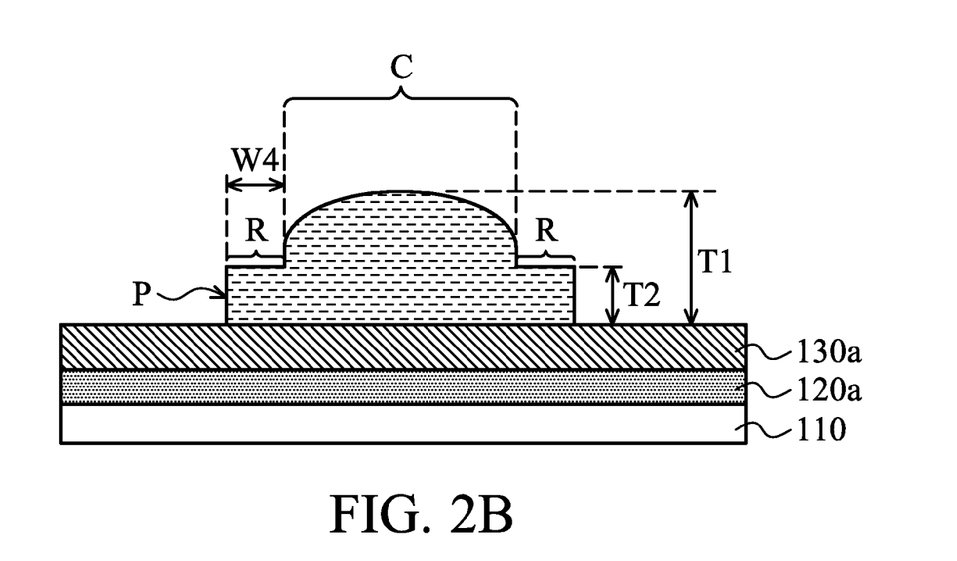

Then, a photoresist material layer P1 is formed on the active material layer 130a, and a photolithography process is performed on the photoresist material layer P1 by using a half tone mask M. In the present embodiment, the half tone mask M has opaque regions A1, transopaque regions A2 (with a transmittance ranging from 1% to 99%) and transparent regions A3. The photoresist material layer P1 is patterned to form a photoresist layer P (as shown in FIG. 2B) by the photolithography process, and the photoresist layer P has a peripheral portion R with a smaller thickness. Specifically, in the present embodiment, the photoresist layer P has a central portion C and a peripheral portion R surrounding the central portion C, wherein the thickness T1 of the central portion C is larger than the thickness T2 of the peripheral portion R.

Figure 2C:
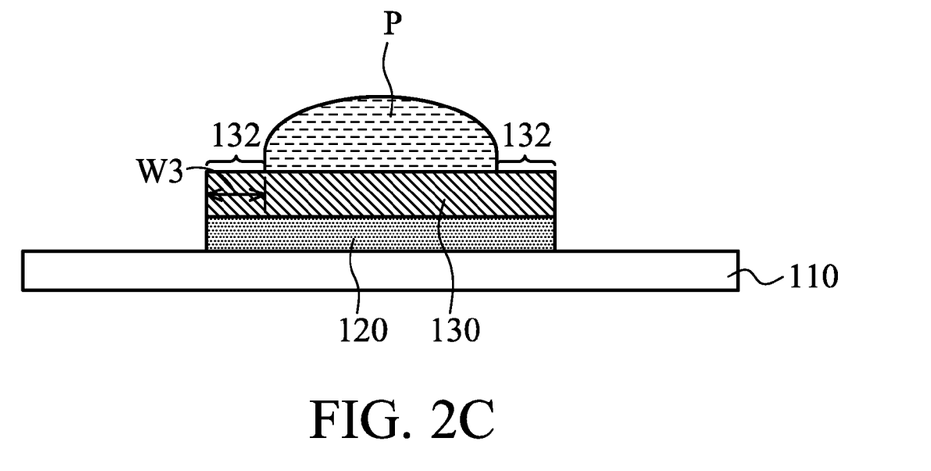

Then, referring to FIGS. 2B and 2C, an etching process is performed on the light-blocking material layer 120a and the active material layer 130a by using the photoresist layer P as an etching mask to form a light-blocking layer 120 and an active layer 130. Specifically, in the present embodiment, the etching process includes, for example, performing a wet etching process (or a dry etching process) on the active material layer 130a and the light-blocking material layer 120a. Then, the peripheral portion R of the photoresist layer P is removed by, for example, plasma ashing to expose a peripheral portion 132 of the active layer 130. In the present embodiment, the maximum width W3 of the peripheral portion 132 of the active layer 130 is substantially equal to the maximum width W4 of the peripheral portion R of the photoresist layer P.

Figure 2D:
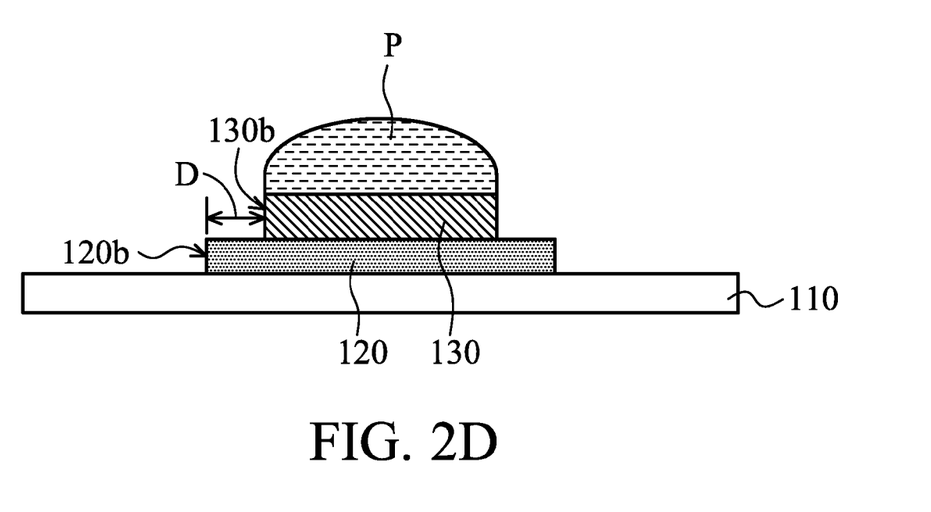

Then, referring to FIG. 2D, the peripheral portion 132 of the active layer 130 is removed by, for example, wet etching with using the photoresist layer P as an etching mask, such that the edge 130b of the active layer 130 is recessed from the edge 120b of the light-blocking layer 120. Then, the photoresist layer P is removed.

It should be noted that the edge 130b of the active layer 130 is recessed from the edge 120b of the light-blocking layer 120 by a distance D, wherein the distance D is substantially equal to the maximum width W3 of the peripheral portion 132 of the active layer 130, and the maximum width W3 is substantially equal to the maximum width W4 of the peripheral portion R of the photoresist layer P. Thus the recessing distance D of the edge 130b of the active layer 130 may be controlled by controlling the maximum width W4 of the peripheral portion R of the photoresist layer P to improve the light-blocking effect. In one embodiment, the distance D is about 3 μm to about 20 μm. In another embodiment, the distance D is about 3 μm to about 10 μm, such as 3 μm-5 μm.

Figure 2E:
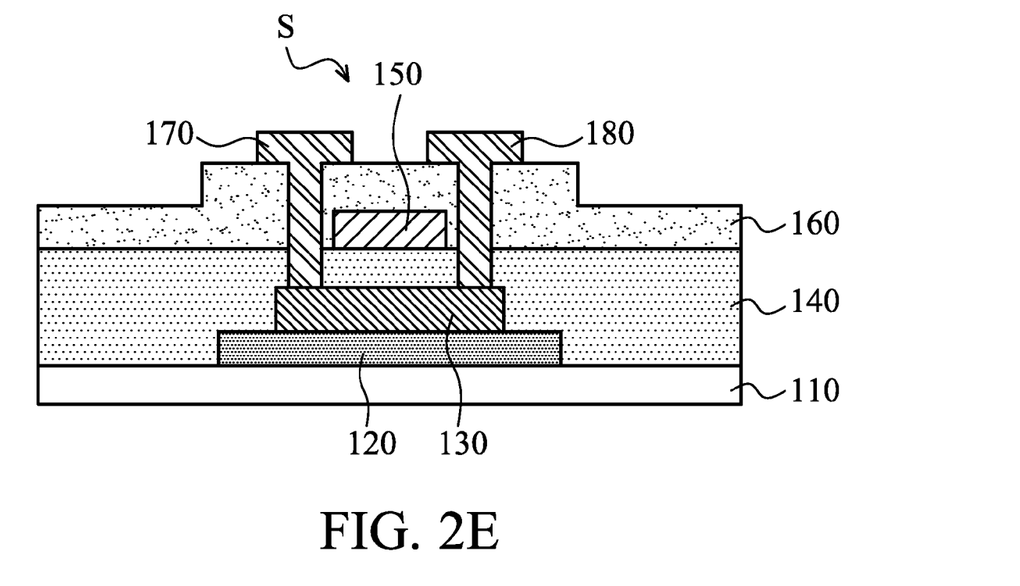

Then, referring to FIG. 2E, a gate insulating layer 140 is formed on the substrate 110 and covers the active layer 130. Then, a gate electrode 150 is formed on the gate insulating layer 140, wherein the gate electrode 150 is located over the active layer 130.

Then, an insulating protective layer 160 is optionally formed on the gate insulating layer 140 and covers the gate electrode 150. Then, a source electrode 170 and a drain electrode 180 are formed on the insulating protective layer 160, wherein the source electrode 170 and the drain electrode 180 may pass through the insulating protective layer 160 and the gate insulating layer 140 to electrically connect to the active layer 130. In this case, the light-blocking layer 120, the active layer 130, the gate insulating layer 140, the gate electrode 150, the source electrode 170 and the drain electrode 180 constitute a thin film transistor S. It should be noted that FIGS. 2A-2E omit showing the forming of a plurality of thin film transistors S on other portion of the substrate 110 by using the above method.

Figure 3:
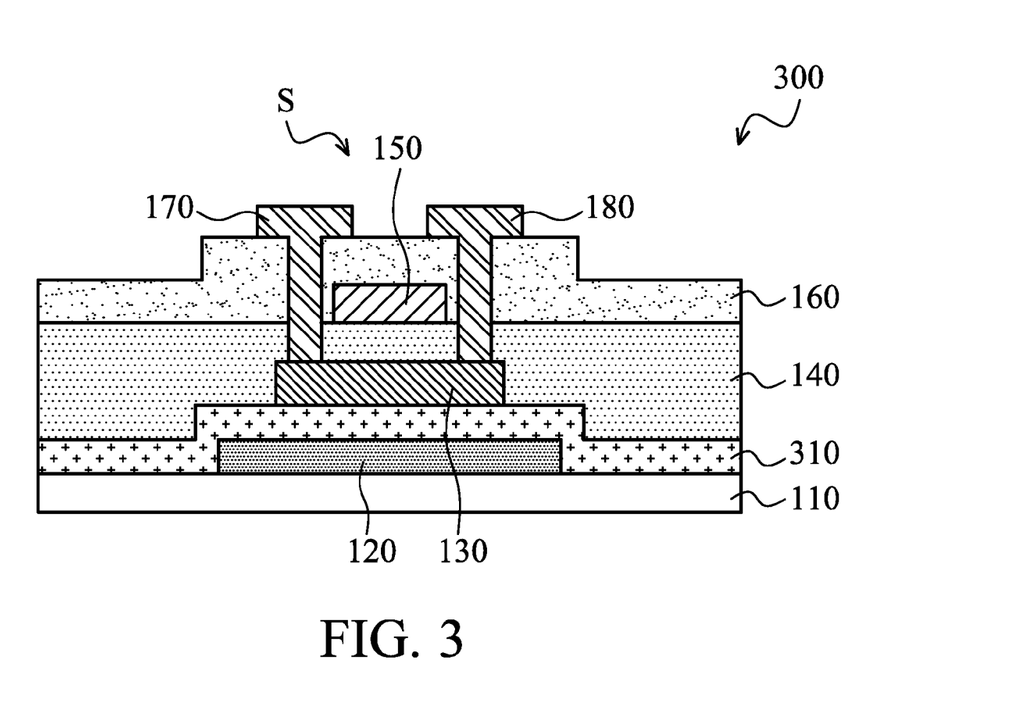
FIG. 3 is a cross-sectional view of a thin film transistor substrate according to another embodiment of the present invention.

FIG. 3 is a cross-sectional view of a thin film transistor substrate according to another embodiment of the present invention. Referring to FIG. 3, in one embodiment, a diffusion barrier layer 310 covering the light-blocking layer 120 is formed on the substrate 110 before forming the active layer 130, and then the active layer 130 is formed on the diffusion barrier layer 310. As such, the diffusion barrier layer 310 between the light-blocking layer 120 and the active layer 130 may separate the light-blocking layer 120 from the active layer 130 to prevent the materials of the light-blocking layer 120 from diffusing into the active layer 130, which affects electrical properties of the active layer 130.

In one embodiment, the diffusion barrier layer 310 may include an insulating material, such as an organic material or an inorganic material, wherein the organic material includes, for example, Polytetrafluoroethylene or acrylic based materials, and the inorganic material includes oxides or nitrides formed by physical vapor deposition or chemical vapor deposition, wherein the oxides include, for example, aluminum oxides, silicon oxides, titanium oxides or silicon aluminum oxides, and the nitrides include, for example, silicon nitride. In one embodiment, the light-blocking layer 120 includes, for example, a conductive material so as to be used as a bottom-gate electrode and shares the active layer 130 with the gate electrode 150. That is to say, the thin film transistor substrate 300 may be a dual gate thin film transistor substrate.

FIGS. 4A-4D are top views of a manufacturing process of a thin film transistor substrate according to an embodiment of the present invention. FIGS. 5A-5D are cross-sectional views of the structure along sectional lines I-I' in FIGS. 4A-4D. It should be noted that, for the sake of simplicity, FIGS. 4A-4D omit showing the substrate and the light-blocking layer.

Figure 4A:
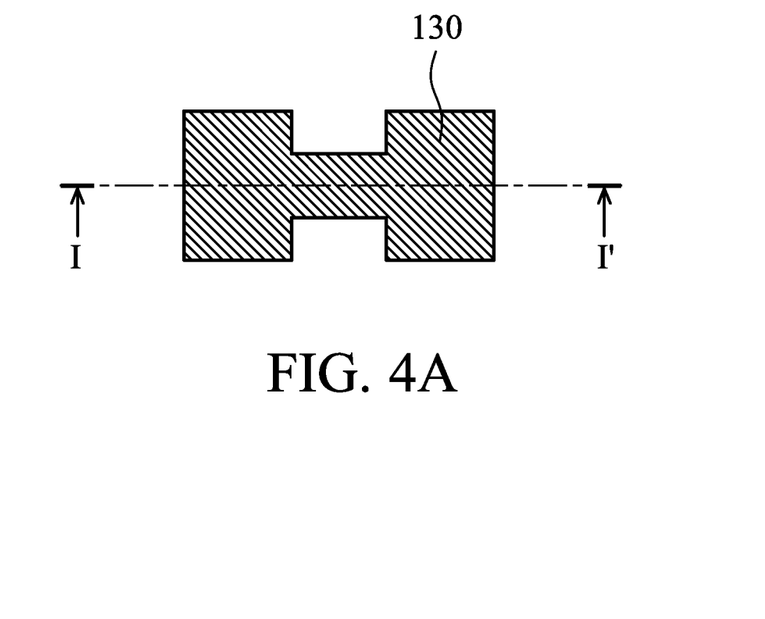
FIGS. 4A-4D are top views of a manufacturing process of a thin film transistor substrate according to an embodiment of the present invention.
Figure 5A:
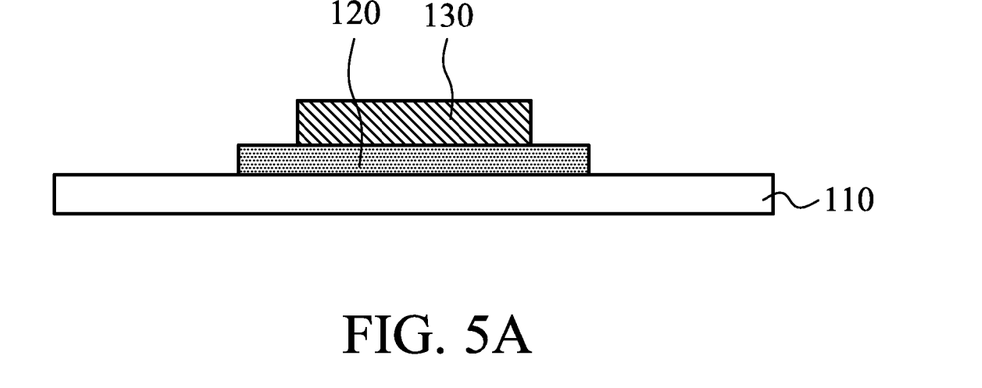
FIGS. 5A-5D are cross-sectional views of the structure along sectional lines I-I' in FIGS. 4A-4D.

Referring to FIGS. 4A and 5A, a substrate 110, a light-blocking layer 120 and an active layer 130 are formed by the manufacturing method similar to that of the embodiments of FIGS. 1A-1C or FIGS. 2A-2E.

Figure 4B:
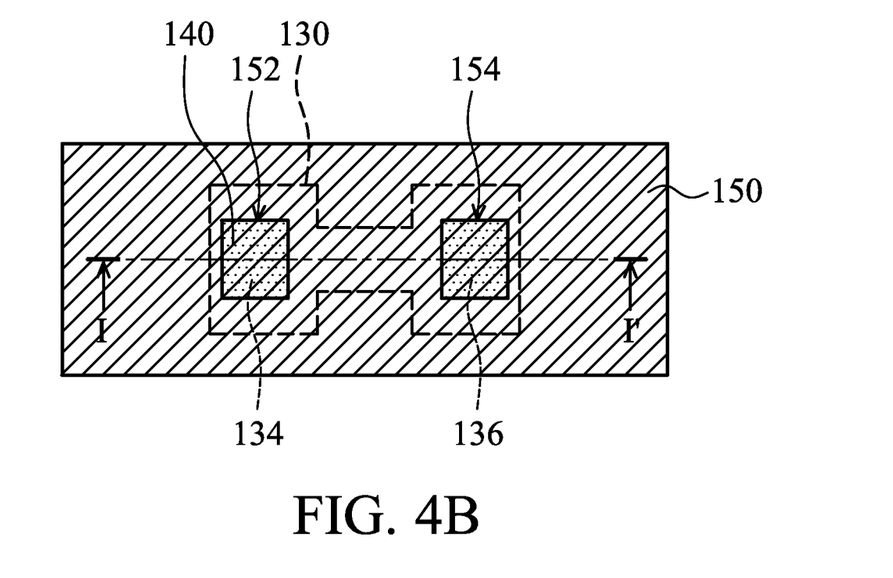
Figure 5B:
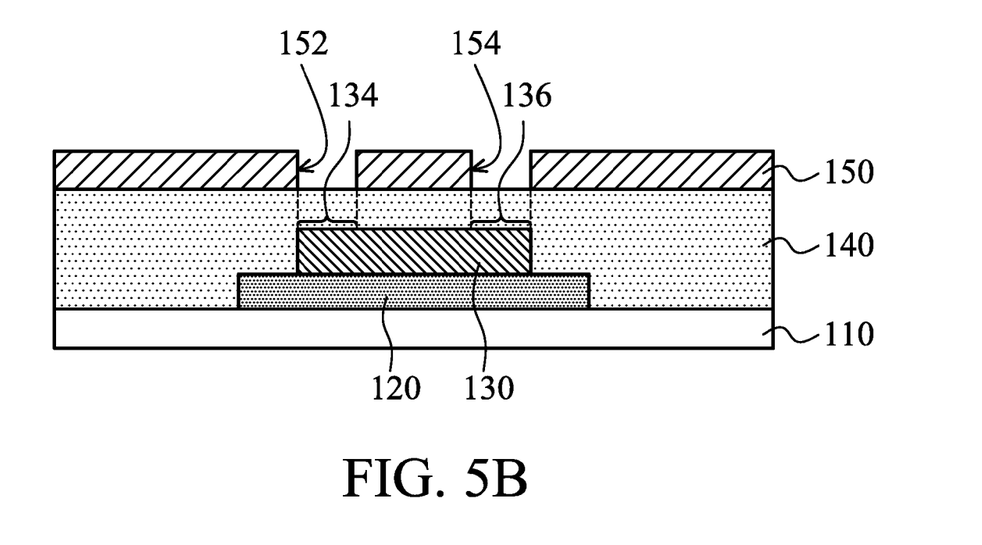

Then, referring to FIGS. 4B and 5B, a gate insulating layer 140 is formed on the substrate 110 and covers the active layer 130. Then, a gate electrode 150 is formed on the gate insulating layer 140, and the gate electrode 150 is located over the active layer 130. The gate electrode 150 has a first opening 152 and a second opening 154, wherein the first opening 152 and the second opening 154 are located respectively above a first portion 134 and a second portion 136 of the active layer 130 to expose the gate insulating layer 140 on the first portion 134 and the second portion 136.

Specifically, in the top view of FIG. 4B, the gate electrode 150 shields most of the active layer 130 and only exposes the first portion 134 and the second portion 136 of the active layer 130.

Figure 4C:
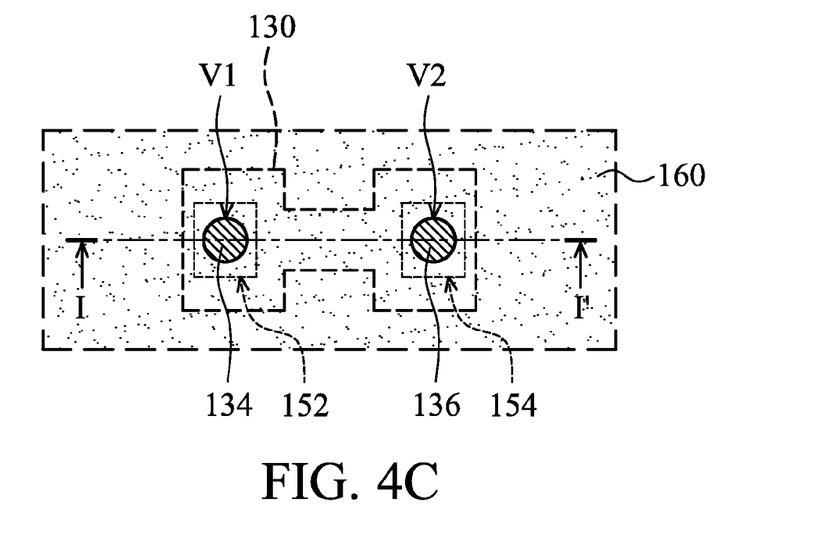
Figure 5C:
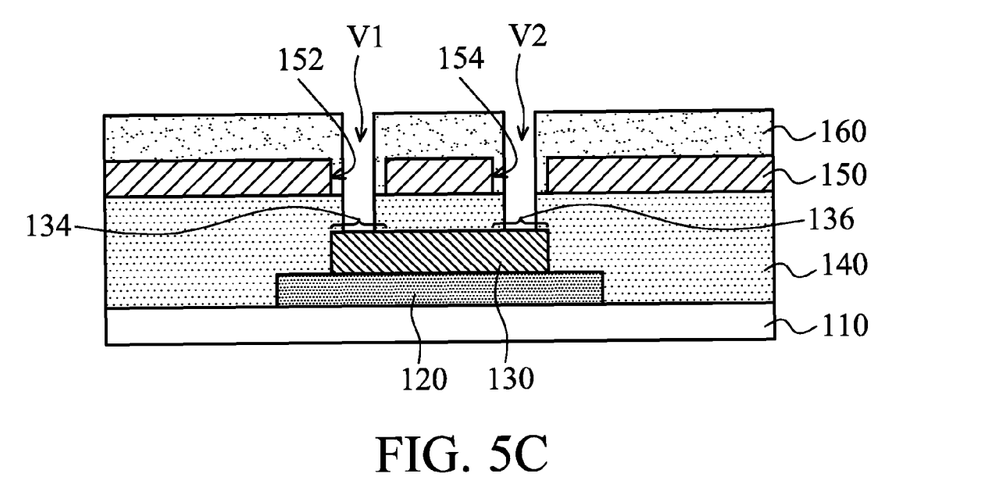

Then, referring to FIGS. 4C and 5C, an insulating protective layer 160 is optionally formed on the gate insulating layer 140 and covers the gate electrode 150. Then, a first through hole V1 and a second through hole V2 are formed and pass through the insulating protective layer 160 and the gate insulating layer 140, wherein the first through hole V1 exposes the first portion 134 through the first opening 152, and the second through hole V2 exposes the second portion 136 through the second opening 154. The first opening 152 is larger than the first through hole V1, and the second opening 154 is larger than the second through hole V2. In one embodiment, the distance between the edge of first through hole V1 and the edge of the first opening 152 is less than 3 μm, and the distance between the edge of the second through hole V2 and the edge of the second opening 154 is less than 3 μm. In a preferable embodiment, the first opening 152 is larger than the first through hole V1, the second opening 154 is larger than the second through hole V2, and the distance between the edge of the first through hole V1 and the edge of the first opening 152 is less than 3 μm.

Figure 4D:
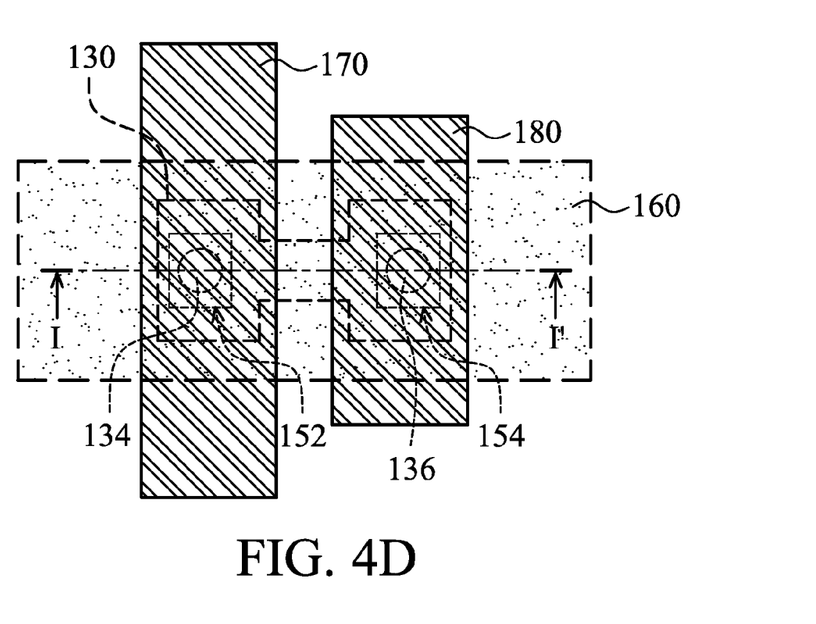
Figure 5D:
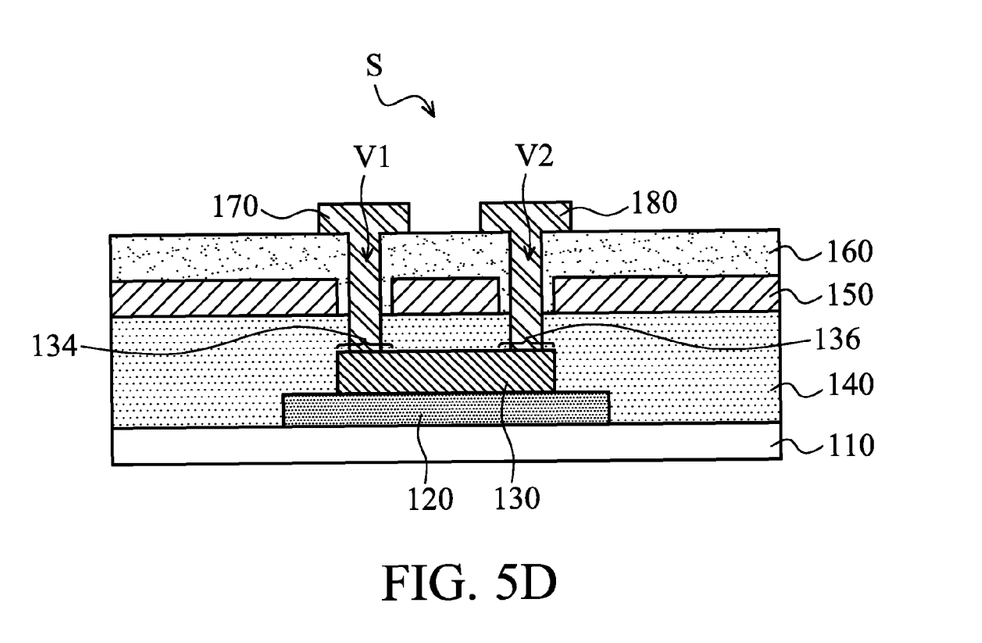

Then, referring to FIGS. 4D and 5D, a source electrode 170 and a drain electrode 180 are formed on the insulating protective layer 160, wherein the source electrode 170 extends into the first through hole V1 to connect to the first portion 134 of the active layer 130, and the drain electrode 180 extends into the second through hole V2 to connect to the second portion 136 of the active layer 130. In this case, the light-blocking layer 120, the active layer 130, the gate insulating layer 140, the gate electrode 150, the source electrode 170 and the drain electrode 180 constitute a thin film transistor S. It should be noted that FIGS. 4A-4D and 5A-5D omit showing the forming of a plurality of thin film transistors S on other portion of the substrate 110 by using the above method.

In the present embodiment, referring to the top view of FIG. 4D, the source electrode 170 completely shields the first portion 134, and the drain electrode 180 completely shields the second portion 136. That is to say, the first portion 134 exposed by the gate electrode 150 is completely shielded by the source electrode 170, and the second portion 136 exposed by the gate electrode 150 is completely shielded by the drain electrode 180.

In short, the source electrode 170, the drain electrode 180 and the gate electrode 150 on the active layer 130 constitute an upper light-blocking structure. In the top view of the thin film transistor substrate, the upper light-blocking structure completely shields the active layer 130, which prevents the active layer 130 from being irradiated by the light coming from above the thin film transistor substrate.

Figure 6:
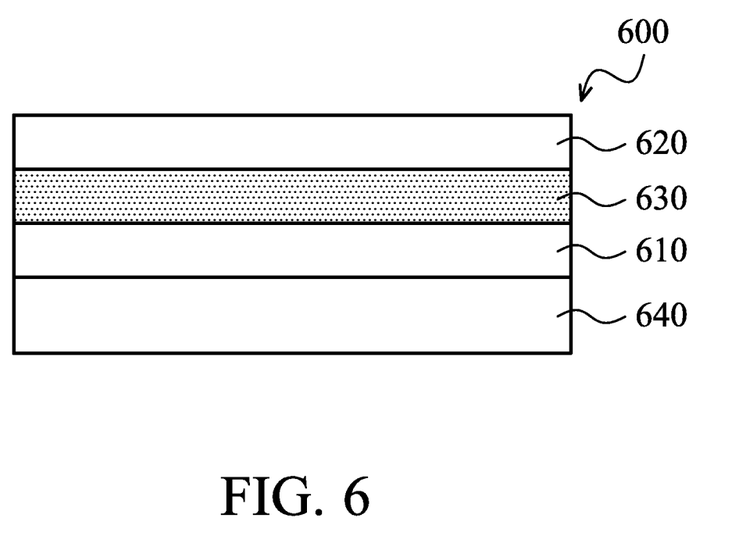
FIG. 6 is a cross-sectional view of a display according to an embodiment of the present invention.

FIG. 6 is a cross-sectional view of a display according to an embodiment of the present invention. Referring to FIG. 6, the display 600 of the present embodiment includes a thin film transistor substrate 610, a substrate 620 and a display medium 630 sandwiched therebetween. The thin film transistor substrate 610 may be the thin film transistor substrate shown in FIG. 1C, 2E, 3 or 5D. The display medium 630 may be a liquid crystal layer or an organic light emitting layer. The substrate 620 is, for example, a color filter substrate or a transparent substrate. The thin film transistor substrate 610, the substrate 620 and the display medium 630 may be disposed on a backlight module 640, wherein the backlight module 640 serves as a backlight source.

In light of the foregoing, in the present invention, the light-blocking layer is disposed between the substrate and the active layer to block the light from below, which improves the stability of electrical properties of the active layer. Furthermore, the edge of the active layer is recessed from the edge of the light-blocking layer, and thereby the light-blocking layer may more effectively block the light from below.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A thin film transistor substrate, comprising:
   a substrate;
   a plurality of thin film transistors disposed on the substrate, wherein each of the thin film transistors comprises:
   a light-blocking layer disposed on the substrate;
   an active layer disposed on the light-blocking layer and overlapped with the light-blocking layer, wherein the active layer is divided into a first portion, a second portion, and a third portion;
   a gate insulating layer disposed on the substrate and covering the active layer;
   a gate electrode disposed on the gate insulating layer and over the active layer, the gate electrode including a first opening and a second opening located respectively above the first portion and the second portion of the active layer, and the gate electrode shielding the third portion of the active layer and exposing the first portion and the second portion of the active layer;
   a source electrode disposed on the substrate and electrically connected to the first portion of the active layer through the first opening; and
   a drain electrode disposed on the substrate and electrically connected to the second portion of the active layer through the second opening.

2. The thin film transistor substrate as claimed in claim 1, wherein the active layer comprises indium-gallium-zinc oxides.

3. The thin film transistor substrate as claimed in claim 2, wherein the maximum width of the active layer is smaller than the maximum width of the light-blocking layer by about 1 µm to about 6 µm.

4. The thin film transistor substrate as claimed in claim 1, wherein the light-blocking layer comprises metal materials or opaque polymer materials.

5. The thin film transistor substrate as claimed in claim 1, further comprising:
   an insulating protective layer disposed on the gate insulating layer and covering the gate electrode, wherein a first through hole and a second through hole pass through the insulating protective layer and the gate insulating layer corresponding to the source electrode and the drain electrode, and the source electrode and the drain electrode are located on the insulating protective layer and electrically connected to the active layer respectively through the first through hole and the second through hole.

6. The thin film transistor substrate as claimed in claim 1, further comprising:
   a diffusion barrier layer disposed between the light-blocking layer and the active layer to separate the light-blocking layer from the active layer.

7. The thin film transistor substrate as claimed in claim 6, wherein the light-blocking layer comprises a conductive material so as to be used as a bottom-gate electrode and shares the active layer with the gate electrode.

8. The thin film transistor substrate as claimed in claim 1, wherein the source electrode, the drain electrode and the gate electrode on the active layer constitute an upper light-blocking structure, wherein in the top view of the thin film transistor substrate, the upper light-blocking structure shields the active layer, which prevents the active layer from being irradiated by the light coming from above the thin film transistor substrate.

9. The thin film transistor substrate as claimed in claim 8, wherein the source electrode and the drain electrode completely shield the first portion and the second portion respectively.

10. The thin film transistor substrate as claimed in claim 9, wherein the first opening is larger than the first through hole, and the distance between the edge of the first through hole and the edge of the first opening is less than 3 µm.

11. A manufacturing method of a thin film transistor substrate, comprising:
    providing a substrate;
    forming a light-blocking layer on the substrate;
    forming an active layer on the light-blocking layer, wherein at least a portion of the edge of the active layer is recessed from a portion of the edge of the light-blocking layer by about 0.5 µm to about 3 µm, wherein the active layer is divided into a first portion, a second portion, and a third portion;
    forming a gate insulating layer covering the active layer on the substrate;
    forming a gate electrode on the gate insulating layer, wherein the gate electrode is over the active layer, wherein the gate electrode including a first opening and a second opening located respectively above the first portion and the second portion of the active layer, and wherein the gate electrode shielding the third portion of the active layer and exposing the first portion and the second portion of the active layer; and
    forming a source electrode and a drain electrode on the substrate, wherein the source electrode and the drain electrode are respectively electrically connected to the first portion of the active layer through the first opening and electrically connected to the second portion of the active layer through the second opening.

12. The manufacturing method of the thin film transistor substrate as claimed in claim 11, wherein the forming of the light-blocking layer and the active layer comprises:
    forming a light-blocking material layer on the substrate;
    forming a active material layer on the light-blocking material layer;
    forming a photoresist layer patterned on the active material layer;
    performing an etching process on the light-blocking material layer and the active material layer by using the photoresist layer as an etching mask to form the light-blocking layer and the active layer, wherein the maximum width of the active layer is smaller than the maximum width of the light-blocking layer by about 1 μm to about 6 μm; and
    removing the photoresist layer.

13. The manufacturing method of the thin film transistor substrate as claimed in claim 12, wherein the etching process comprises:
    performing a wet etching process on the active material layer; and
    performing a dry etching process or a wet etching process on the light-blocking material layer.

14. The manufacturing method of the thin film transistor substrate as claimed in claim 11, wherein the forming of the light-blocking layer and the active layer comprises:
    forming a light-blocking material layer on the substrate;
    forming a active material layer on the light-blocking material layer;
    forming a photoresist material layer on the active material layer;
    performing a photolithography process on the photoresist material layer by using a half tone mask to pattern the photoresist material layer so as to form a photoresist layer patterned, wherein the photoresist layer has a peripheral portion with a smaller thickness;
    performing an etching process on the light-blocking material layer and the active material layer by using the photoresist layer as an etching mask to form the light-blocking layer and the active layer, wherein the light-blocking layer and the active layer have the same width;
    removing the peripheral portion of the photoresist layer to expose a peripheral portion of the active layer;
    removing the peripheral portion of the active layer by using the photoresist layer as an etching mask, such that the maximum width of the active layer is smaller than the maximum width of the light-blocking layer by about 0.5 μm to about 3 μm; and
    removing the photoresist layer.

15. The manufacturing method of the thin film transistor substrate as claimed in claim 14, wherein the etching process comprises:
    performing a wet etching process on the active material layer; and
    performing a wet etching process on the light-blocking material layer.

16. The manufacturing method of the thin film transistor substrate as claimed in claim 11, further comprising:
    before forming the active layer, forming a diffusion barrier layer covering the light-blocking layer on the substrate, and the active layer is formed on the diffusion barrier layer.

17. The manufacturing method of the thin film transistor substrate as claimed in claim 11, further comprising:
    forming an insulating protective layer covering the gate electrode on the gate insulating layer, wherein the source electrode and the drain electrode are formed on the insulating protective layer and pass through the insulating protective layer and the gate insulating layer to connect to the active layer.

18. A display, comprising:
    a thin film transistor substrate as claimed in claim 1;
    a substrate opposite to the thin film transistor substrate; and
    a display medium formed between the thin film transistor substrate and the substrate.

19. The display as claimed in claim 18, wherein the display medium comprises a liquid crystal layer or an organic light emitting layer.

20. The display as claimed in claim 18, further comprising:
    a backlight module, wherein the thin film transistor substrate, the substrate and the display medium are disposed on the backlight module.

* * * * *